(12) United States Patent
Wu et al.

(10) Patent No.: US 10,388,750 B2
(45) Date of Patent: Aug. 20, 2019

(54) SEMICONDUCTOR STRUCTURE AND METHOD FOR FORMING THE SAME

(71) Applicant: Tsinghua University, Beijing (CN)

(72) Inventors: Xian Wu, Beijing (CN); Lei Guo, Beijing (CN); Jing Wang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 69 days.

(21) Appl. No.: 15/305,240

(22) PCT Filed: Jun. 3, 2016

(86) PCT No.: PCT/CN2016/084747
§ 371 (c)(1),
(2) Date: Oct. 19, 2016

(87) PCT Pub. No.: WO2017/121067
PCT Pub. Date: Jul. 20, 2017

(65) Prior Publication Data
US 2018/0047826 A1    Feb. 15, 2018

(30) Foreign Application Priority Data

Jan. 12, 2016  (CN) .......................... 2016 1 0017898
Jan. 12, 2016  (CN) .......................... 2016 1 0018536

(51) Int. Cl.
| | |
|---|---|
| *H01L 33/00* | (2010.01) |
| *H01L 29/51* | (2006.01) |
| *H01L 21/02* | (2006.01) |
| *H01L 21/28* | (2006.01) |
| *H01L 29/04* | (2006.01) |
| *H01L 29/40* | (2006.01) |

(Continued)

(52) U.S. Cl.
CPC ........ *H01L 29/518* (2013.01); *H01L 21/0228* (2013.01); *H01L 21/02071* (2013.01);
(Continued)

(58) Field of Classification Search
CPC ............. H01L 29/518; H01L 21/02071; H01L 21/02178; H01L 21/0228; H01L 21/28264; H01L 29/045
(Continued)

(56) References Cited

U.S. PATENT DOCUMENTS

RE36,747 E * 6/2000 Manabe .............. H01L 33/0037
                                                    257/103
8,786,176 B2 * 7/2014 Lecamp .............. H01L 51/5265
                                                    313/292

(Continued)

FOREIGN PATENT DOCUMENTS

CN        102820430        12/2012
CN        103178099        6/2013
(Continued)

OTHER PUBLICATIONS

WIPO, English Translation of International Search Report and Written Opinion for App. No. PCT/CN2016/084747 dated Oct. 19, 2016.

(Continued)

*Primary Examiner* — Tan N Tran
(74) *Attorney, Agent, or Firm* — Hodgson Russ LLP

(57) ABSTRACT

A semiconductor structure and a method for forming the semiconductor structure are provided. The semiconductor structure includes: a substrate, at least a part of an upper surface of the substrate being a nonpolar surface or a semi-polar surface including nitride semiconductor crystals; an interface layer formed on the nonpolar surface or the semi-polar surface, and including at least one selected from a nitride and an oxynitride; and a metal layer formed on a surface of the interface layer away from the substrate.

12 Claims, 4 Drawing Sheets

(51) Int. Cl.
*H01L 21/306* (2006.01)
*H01L 21/3065* (2006.01)
*H01L 29/20* (2006.01)

(52) U.S. Cl.
CPC .. *H01L 21/02178* (2013.01); *H01L 21/28264* (2013.01); *H01L 29/045* (2013.01); *H01L 29/408* (2013.01); *H01L 29/513* (2013.01); *H01L 29/517* (2013.01); *H01L 21/3065* (2013.01); *H01L 21/30612* (2013.01); *H01L 29/2003* (2013.01)

(58) Field of Classification Search
USPC .................................................. 257/76, 98
See application file for complete search history.

(56) References Cited

U.S. PATENT DOCUMENTS

| | | | |
|---|---|---|---|
| 9,048,385 B2 * | 6/2015 | Sanga | H01L 33/02 |
| 9,379,191 B2 * | 6/2016 | Hsu | H01L 29/267 |
| 9,437,672 B2 * | 9/2016 | Okamoto | H01L 29/045 |
| 2005/0116306 A1 | 7/2005 | Iwamoto et al. | |
| 2010/0006894 A1 | 1/2010 | Ohta et al. | |
| 2013/0100978 A1 | 4/2013 | Hardy et al. | |
| 2017/0200833 A1 * | 7/2017 | Conway | H01L 29/8083 |
| 2017/0346258 A1 * | 11/2017 | Kuramoto | H01S 5/34333 |

FOREIGN PATENT DOCUMENTS

| | | |
|---|---|---|
| CN | 105513963 | 4/2016 |
| CN | 105514168 | 4/2016 |
| JP | 2004-349581 | * 12/2004 |
| JP | 2009-152627 | * 7/2009 |
| JP | 2013228476 | 11/2013 |

OTHER PUBLICATIONS

SIPO, Office Action for CN App. No. 201610018536, dated Dec. 27, 2017.

* cited by examiner

SEMICONDUCTOR STRUCTURE AND METHOD FOR FORMING THE SAME

CROSS-REFERENCE TO RELATED APPLICATION

This application is a national phase entry under 35 USC § 371 of International Application PCT/CN2016/084747, filed Jun. 3, 2016, which claims priority to and benefits of Chinese Patent Application Serial No.

FIELD

The present disclosure relates to a field of semiconductor technology and semiconductor fabrication, in particularly to a semiconductor structure, and a method for forming the semiconductor structure.

BACKGROUND

Nitride semiconductor materials (such as GaN, InGaN, AlGaN, InN and AlN), for example, gallium nitride, have a wide direct bandgap, a strong chemical bond, a high thermal conductivity, a good chemical stability and a great anti-radiation performance, which shows great potentials in applications of photoelectron, high temperature and high power devices and high frequency microwave devices, being widely used for fabricating various electronic switches and signal amplifiers.

The nitride semiconductor material generally has a close-packed hexagonal crystal structure. Based on a relative position between a surface of a wafer and c axis of the crystal, the surface may be classified as a polar surface (perpendicular to c axis), a nonpolar surface (parallel to c axis) and a semi-polar surface (neither perpendicular nor parallel to c axis) because of a spontaneous polarization effect. For example, in gallium nitride, a crystal plane of {0001} (also referred to as c-plane) is polar, crystal planes of {10$\bar{1}$0} and {11$\bar{2}$0} (also referred to as m-plane and a-plane, respectively) are nonpolar and a crystal plane of {1$\bar{1}$02} (also referred to as r-plane) is semi-polar. Currently, a GaN wafer with a polar c-plane is most widely studied and used, and there are few studies and applications about the nonpolar and semi-polar planes.

By using magnetron sputtering, atomic layer deposition and etc., dielectric materials may be deposited on a surface of the nitride semiconductor materials. Semiconductor structures with different dielectric/nitride interface characteristics may be fabricated and used in different semiconductor devices.

However, a design and a fabrication method of the dielectric/nitride interface structure based on the nitride semiconductor materials are still to be improved.

SUMMARY

The present application is based on inventors' discoveries and recognitions of the following facts and issues.

A semiconductor structure with a polar surface of nitride semiconductor materials, such as a field effect transistor, generally has disadvantages of a poor interface performance, an unstable threshold voltage and large leakage current. Even if a nitride passivation layer is deposited on the polar surface, the above problem is still remained. Based on a lot of studies and experiments, the inventors have found the reason for such a problem is that the polar surface (c-plane) of the nitride semiconductor material has a strong polarity. Therefore, oxygen atoms are easily adsorbed to an interface, so that unstable bonds between metal atoms and oxygen atoms are formed on the surface of the material, such as Ga—O bond. Such a bond is charged easily and becomes a center of generation and recombination of charge carriers, resulting in a high density of interface traps (Da). In addition, the movable electric charges are easily adsorbed to the interface, so that the interface of the semiconductor structure has more defects, resulting in a poor interface performance. Especially for the field effect transistor, the poor interface performance and the high density of interface traps will cause a serious electric leakage of the transistor.

Embodiments of the present disclosure seek to solve at least one of the problems existing in the related art to at least some extent.

Accordingly, a first object of the present disclosure is to provide a semiconductor structure, in which an interface layer is formed on a nonpolar surface or a semi-polar surface of a substrate. The interface performance of the semiconductor structure may be improved by a significantly reduced adsorption effect on the oxygen atoms and the movable electric charges to the nonpolar surface or semi-polar surface.

A second aspect of the present disclosure is to provide a field effect transistor comprising the semiconductor structure.

A third object of the present disclosure is to provide a method for forming a semiconductor structure, in which an interface layer is formed on a nonpolar surface or a semi-polar surface of a substrate. The interface performance of the semiconductor structure may be improved by a significantly reduced adsorption ability of the nonpolar surface or semi-polar surface to the oxygen atoms and the movable electric charges.

In a first aspect of the present disclosure, a semiconductor structure is provided. According to embodiments of the present disclosure, the semiconductor structure includes: a substrate, at least a part of an upper surface of the substrate being a nonpolar surface or a semi-polar surface including nitride semiconductor crystals; an interface layer formed on the nonpolar surface or the semi-polar surface, and including at least one selected from a nitride and an oxynitride; and a metal layer formed on a surface of the interface layer away from the substrate. Thus, the interface layer may be formed on the nonpolar surface or the semi-polar surface. The substrate may be passivated by the interface layer, so that forming of the unstable bonds on the surface of the substrate may be avoided effectively, and the interface quality may be improved, thus effectively improving the interface performance of the semiconductor structure.

In addition, the semiconductor structure according to embodiments of the present disclosure may further have at least one of the following additional technical features:

In an embodiment, the semiconductor structure further comprises a dielectric layer formed between the interface layer and the metal layer. Thus, the dielectric layer may be formed on the interface layer based on the passivation of the substrate by the interface layer, thus effectively improving the interface performance of the semiconductor structure.

In an embodiment, in the semiconductor structure, the substrate includes at least one crystal sub-layer including at least one selected from GaN crystals, InGaN crystals, AlGaN crystals and AlN crystals. Thus, since the substrate includes the crystal sub-layer described above, the material of the substrate may have higher electron mobility and breakdown electric field strength, so that the performance of the semiconductor structure may be further improved. Specifically, the crystal sub-layer may grow on a silicon substrate, a silicon carbide (SiC) substrate or a sapphire substrate, or may grow on a freestanding GaN wafer or a freestanding AlN wafer.

In an embodiment, in the semiconductor structure, the substrate is a gallium nitride wafer or an aluminium nitride wafer. Specifically, the substrate may be a freestanding GaN wafer, a silicon-based gallium nitride wafer, a SiC-based gallium nitride wafer, a sapphire-based gallium nitride wafer, a freestanding AlN wafer, a silicon-based aluminium nitride wafer, a SiC-based aluminium nitride wafer, or a sapphire-based aluminium nitride wafer. The above wafer materials may be obtained easily from a wealth of sources, thus extending the application range of the semiconductor structure.

In an embodiment, in the semiconductor structure, the interface layer is amorphous. Usually, a dielectric material is amorphous. The interface layer may be fabricated by the technology and apparatus for forming the dielectric layer, thus simplifying the process and device for forming the interface layer. In addition, the interface layer is formed from amorphous materials, so that the interface defects may be reduced, thus improving the interface performance of the semiconductor structure.

In an embodiment, in the semiconductor structure, the interface layer includes aluminium nitride or aluminium oxynitride. Thus, the interface performance of the semiconductor structure may be further improved.

In an embodiment, in the semiconductor structure, the dielectric layer includes a high k dielectric. Thus, the dielectric layer may have higher dielectric constant. In the case of a same gate capacitance, a thickness of the dielectric layer may be increased, so that the gate leakage may be decreased, and the performance of the semiconductor structure may be further improved.

In an embodiment, in the semiconductor structure, the high k dielectric includes at least one selected from $Al_2O_3$. $HfO_2$ and $TiO_2$. Thus, the material of high k dielectric layer is suitable for the interface layer and the nitride semiconductor, which improves the performance of the semiconductor structure.

In an embodiment, in the semiconductor structure for MISFET (metal-insulator-semiconductor field effect transistor) application, a thickness of the interface layer is in a range of 2 to 100 nm. The MISFET includes a stacked structure of the metal layer/the interface layer/the substrate. In an embodiment, the interface layer is formed by amorphous aluminium nitride or amorphous aluminium oxynitride, which is electrically insulated and could be served as an insulator layer in MISFET. For a common low voltage device, a thickness of the interface layer may be controlled in the range of 2 to 10 nm, so that the interface quality may be improved by the interface layer with an appropriate thickness and it is also possible to prevent an over thick interface layer from decreasing the capacitance of the gate dielectric, thus preventing an increase in the electric leakage of the semiconductor structure caused by a decrease in the control ability of the gate. For a high voltage device reaching hundreds or thousands of volts, the thickness of the interface layer may be controlled in the range of tens of nanometers.

In another embodiment, in the semiconductor structure for MOSFET (metal-oxide-semiconductor field effect transistor) application, a thickness of the interface layer is in a range of 1 to 3 nm. The MOSFET includes a stacked structure of the metal layer/the dielectric layer/the interface layer/the substrate, in which the dielectric layer is served as an oxide layer. The thickness of the interface layer may be controlled in the above range, so that the interface quality may be improved by using the interface layer with an appropriate thickness and it is also possible to prevent an over thick interface layer from decreasing the capacitance of the gate dielectric, thus preventing an increase in the electric leakage of the semiconductor structure caused by a decrease in the control ability of the gate.

In an embodiment, the interface layer is formed by atomic layer deposition. In an embodiment, in the semiconductor structure, the dielectric layer is formed by atomic layer deposition. The atomic layer deposition is the most common method to prepare the gate dielectric film, which has a low process cost. The interface layer and the dielectric layer are deposited in turn by such a method. The thicknesses and compositions of the interface layer and the dielectric layer may be controlled strictly so as to ensure the performance of the semiconductor structure. Meanwhile, the dielectric layer is in situ deposited immediately following the deposition of the interface layer, the interface qualities of the interface layer and the dielectric layer may be improved, so that the performance of the semiconductor structure may be further improved. In addition, the cost may be reduced because the process is simplified and the cost of the atomic layer deposition apparatus is low.

In a second aspect of the present disclosure, a field effect transistor is provided. According to embodiments of the present disclosure, the field effect transistor includes a semiconductor structure described above. The field effect transistor has a metal-insulator-semiconductor field effect transistor (MISFET) structure or a metal-oxide-semiconductor field effect transistor (MOSFET) structure with a nonpolar or semi-polar nitride semiconductor material as a channel. Thus, a semiconductor structure with a great interface performance may be included in the field effect transistor, so that the performance of the field effect transistor may be improved, thus obtaining a MISFET or MOSFET device with a great performance, with the nonpolar or semi-polar nitride semiconductor material as the channel.

In a third aspect of the present disclosure, a method for forming a semiconductor structure is provided. According to embodiments of the present disclosure, the method includes: providing a substrate, at least a part of an upper surface of the substrate being a nonpolar surface or a semi-polar surface including nitride semiconductor crystals; forming an interface layer on the nonpolar surface or the semi-polar surface; and forming a metal layer on a surface of the interface layer away from the substrate.

Thus, the semiconductor structure may be formed on the nonpolar surface or the semi-polar surface. The forming of unstable bonds on the surface of the substrate, which is caused by a strong polarity of the surface of the substrate, may be avoided effectively, and the adsorption effect of the interface on the movable electric charges may be significantly reduced, thus improving the interface performance of the formed semiconductor structure.

In addition, the method for forming a semiconductor structure according to embodiments of the present disclosure may further have at least one of the following additional technical features:

In an embodiment, the method further comprises forming a dielectric layer between the interface layer and the metal layer. The step of forming a dielectric layer between the interface layer and the metal layer may be performed before the step of forming a metal layer on a surface of the interface layer away from the substrate.

In an embodiment, before forming an interface layer on the nonpolar surface or the semi-polar surface, the substrate is subjected to a surface treatment, the surface treatment including: a dry etching or a wet etching, so as to remove natural oxides on a surface of the substrate. Thus, a clean substrate may be obtained, and the efficiency and effect of the subsequent treatment may be improved. It is also possible to prevent the natural oxides described above from affecting the performance of the semiconductor structure fabricated by such a method.

In an embodiment, the dry etching is a plasma etching with $N_2$ as a gas source. Thus, the plasma may be used to remove the oxides on the surface of the substrate by etching, so that the efficiency and effect of the method may be improved.

In an embodiment, the wet etching is an aqua regia etching. Thus, the aqua regia may be used to remove the oxides on the surface of the substrate by chemical etching, so that the efficiency and effect of the method may be improved.

In an embodiment, in forming an interface layer on the nonpolar surface or the semi-polar surface, the interface layer is formed by atomic layer deposition. In an embodiment, the dielectric layer is formed by atomic layer deposition. Thus, the interface layer and the dielectric layer may be formed easily by the same method and apparatus, so that the efficiency and effect of the semiconductor structure fabricated by such a method may be further improved while reducing the cost.

In an embodiment, when the interface layer and the dielectric layer are formed by atomic layer deposition respectively, a temperature of the substrate is in a range of 200 to 400° C. Thus, the qualities of the interface layer and the dielectric layer formed by the atomic layer deposition may be controlled, and the performance of the semiconductor structure formed by such a method may be further improved.

In an embodiment, the substrate includes at least one crystal sub-layer including at least one selected from GaN crystals, InGaN crystals, AlGaN crystals and AlN crystals. Thus, since the substrate includes the crystal sub-layer described above, the material of the substrate may have higher electron mobility and breakdown electric field strength, so that the performance of the semiconductor structure formed by such a method may be further improved. Specifically, the crystal sub-layer may grow on a silicon substrate, a SiC substrate or a sapphire substrate, or may grow on a freestanding GaN wafer or a freestanding AlN wafer.

In an embodiment, the substrate is a gallium nitride wafer or an aluminium nitride wafer. Specifically, the substrate may be a freestanding GaN wafer, a silicon-based gallium nitride wafer, a SiC-based gallium nitride wafer, a sapphire-based gallium nitride wafer, a freestanding AlN wafer, a silicon-based aluminium nitride wafer, a SiC-based aluminium nitride wafer, or a sapphire-based aluminium nitride wafer. The above wafer materials may be obtained easily from a wealth of sources, thus extending the application range of the semiconductor structure.

In an embodiment, the interface layer is amorphous. Usually, a dielectric material is amorphous. The interface layer may be fabricated by the technology and apparatus for forming the dielectric layer, thus simplifying the process and device for forming the interface layer. In addition, the interface layer is formed from amorphous materials, so that the interface defects may be reduced, thus improving the interface performance of the semiconductor structure formed by such a method.

In an embodiment, the interface layer includes aluminium nitride or aluminium oxynitride. Thus, the interface performance of the semiconductor structure formed by such a method may be further improved.

In an embodiment, the dielectric layer includes a high k dielectric. Thus, the dielectric layer may have higher dielectric constant. In the case of a same gate capacitance, a thickness of the dielectric layer may be increased, so that the gate leakage may be decreased, and the interface performance of the semiconductor structure may be further improved.

In an embodiment, in the semiconductor structure, the high k dielectric includes at least one selected from $Al_2O_3$, $HfO_2$ and $TiO_2$. Thus, the material of high k dielectric layer is suitable for the interface layer and the nitride semiconductor, which improves the performance of the semiconductor structure formed by such a method.

In an embodiment, in the semiconductor structure for MISFET (metal-insulator-semiconductor field effect transistor) application, a thickness of the interface layer is in a range of 2 to 100 nm. The MISFET includes a stacked structure of metal/insulator layer/semiconductor channel. In an embodiment, the interface layer is formed by amorphous aluminium nitride or amorphous aluminium oxynitride, which is electrically insulated and could be served as the insulator layer in MISFET with the nonpolar or semi-polar nitride semiconductor substrate as the semiconductor channel. For a common low voltage device, a thickness of the interface layer may be controlled in the range of 2 to 10 nm, so that the interface quality may be improved by the interface layer with an appropriate thickness and it is also possible to prevent an over thick interface layer from decreasing the capacitance of the gate dielectric, thus preventing an increase in the electric leakage of the semiconductor structure caused by a decrease in the control ability of the gate. For a high voltage device reaching hundreds or thousands of volts, the thickness of the interface layer may be controlled in the range of tens of nanometers.

In another embodiment, in the semiconductor structure for MOSFET (metal-oxide-semiconductor field effect transistor) application, a thickness of the interface layer is in a range of 1 to 3 nm. The MOSFET includes a stacked structure of metal/dielectric layer/interface layer/semiconductor channel, in which the nonpolar or semi-polar nitride semiconductor substrate is served as the semiconductor channel, and the dielectric layer is served as an oxide layer. The thickness of the interface layer may be controlled in the above range, so that the interface quality may be improved by using the interface layer with an appropriate thickness and it is also possible to prevent an over thick interface layer from decreasing the capacitance of the gate dielectric, thus preventing an increase in the electric leakage of the semiconductor structure caused by a decrease in the control ability of the gate.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
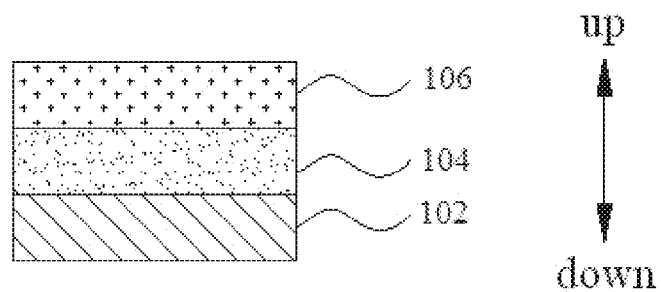
FIG. 1 is a schematic cross-sectional view of a semiconductor structure according to an embodiment of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the description of the present disclosure, a structure in which a first feature is "on" a second feature may include an embodiment in which the first feature directly contacts the second feature, and may also include an embodiment in which an additional feature is formed between the first feature and the second feature so that the first feature does not directly contact the second feature, unless otherwise specified. Furthermore, a first feature "on," "above," or "above" a second feature may include an embodiment in which the first feature is right "on," "above," or "above" the second feature, and may also include an embodiment in which the first feature is not right "on," "above," or "above" the second feature, or just means that the first feature has a sea level elevation larger than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation smaller than the sea level elevation of the second feature.

In a first aspect, a semiconductor structure is provided. According to embodiments of the present disclosure, with reference to FIG. 1, the semiconductor structure includes: a substrate 102, an interface layer 104, and a metal layer 106. Specifically, the substrate 102 may include nitride semiconductor crystals and a surface of the substrate 102 is a nonpolar surface or a semi-polar surface. The interface layer 104 is formed on the nonpolar surface or the semi-polar surface. i.e., an upper surface of the substrate 102. The metal layer 106 is formed on a surface of the interface layer 104 away from the substrate 102, i.e., an upper surface of the substrate 102. Thus, the semiconductor structure according to embodiments of the present disclosure may be formed on the nonpolar surface or the semi-polar surface of the substrate 102, which has a significantly reduced adsorption ability, so that unstable chemical bonds between the metal atoms and the oxygen atoms may be decreased effectively, and movable electric charges at the interface may also be decreased at the same time, thus avoiding a negative influence on the interface performance.

Figure 2:
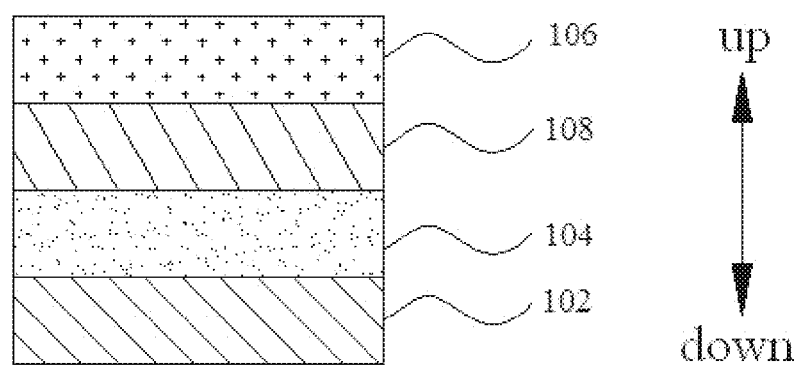
FIG. 2 is a schematic cross-sectional view of a semiconductor structure according to another embodiment of the present disclosure.

In an embodiment, as shown in FIG. 2, the semiconductor structure further comprises a dielectric layer 108. The dielectric layer 108 is formed between the interface layer 104 and the metal layer 106. Thus, the dielectric layer 108 may be formed on the interface layer 104 based on the passivation of the substrate 102 by the interface layer 104, thus effectively improving the interface performance of the semiconductor structure.

It should be understood that, in the specification of the present disclosure, the term "upper surface" particularly refers to the surface of the substrate 102 on which the interface layer 104 is formed, and at least a part of the upper surface formed from nitride semiconductor crystals is nonpolar or semi-polar. It should be understood that the "upper surface" should be understood in a broad sense, that is, any surface of the substrate 102 exposed to the environment, and at least a part of such a surface formed from nitride semiconductor crystals is nonpolar or semi-polar and the interface layer 104 is formed on the nonpolar surface or the semi-polar surface.

Each layer of the semiconductor structure according to embodiments of the present disclosure is described in details below.

According to embodiments of the present disclosure, the substrate 102 may include at least one crystal sub-layer including at least one selected from GaN crystals, InGaN crystals, AlGaN crystals and AlN crystals. Thus, since the substrate includes the crystal sub-layer described above, the material of the substrate may have higher electron mobility and breakdown field strength, so that the performance of the semiconductor structure may be further improved. Furthermore, a substrate 102 with a suitable crystal sub-layer may be selected according to a specific requirement of the semiconductor device for the semiconductor structure in practice. In order to meet the specific requirement of devices with different functions for the semiconductor structure, a substrate 102 having a plurality of sub-layers with same or different chemical compositions may also be used, such as AlGaN/GaN/AlGaN, AlGaN/GaN. InGaN/GaN or AlGaN/InGaN/AlGaN multilayered structures or a GaN single layer structure, so that the application range of the semiconductor structure may be further extended. According to another embodiment of the present disclosure, in the semiconductor structure, the substrate 102 may be a freestanding GaN wafer, a silicon-based gallium nitride wafer, a SiC-based gallium nitride wafer, a sapphire-based gallium nitride wafer, the freestanding AlN wafer, a silicon-based aluminium nitride wafer, a SiC-based aluminium nitride wafer, or a sapphire-based aluminium nitride wafer. Thus, the above wafer, which has a wealth of sources and is easy to obtain, may be selected as the substrate 102, only if the above wafer has a semi-polar surface or a nonpolar surface. Based on a further study, the inventors have found that, compared with a polar surface, the semi-polar surface or nonpolar surface has much lower adsorption ability for oxygen atoms and movable electric charges. Therefore, based on the semiconductor structure with the semi-polar surface or nonpolar surface described above, unstable chemical bonds between metal atoms in the substrate 102 and oxygen atoms in the interface layer 104 or the environment may be decreased effectively, such as a Ga—O bond, an adsorption of the interface for the movable electric charges from the dielectric layer 108 and the substrate 102 may be decreased at the same time. Thus, a density of interface traps may be decreased significantly, so as to improve the interface performance of the semiconductor structure.

According to embodiments of the present disclosure, the interface layer 104 may be formed from at least one of a nitride and an oxynitride. Specifically, according to embodiments of the present disclosure, the interface layer 104 may be formed by aluminium nitride or aluminium oxynitride. Stability of chemical bond of the aluminium nitride or aluminium oxynitride is much higher than that of Ga—O bond. Thus, the interface layer 104 may be formed from the above materials to improve the interface quality and inhibit diffusion of Al, N and O atoms to the surface of the substrate 102, so that the unstable chemical bond Ga—O on the substrate 102 may be decreased. Furthermore, the interface layer 104 may prevent the oxygen atoms in the dielectric layer 108 and the environment from diffusing to the surface of the substrate 102, so that the formation of a harmful chemical bond Ga—O of the substrate 102 may be further inhibited. According to another embodiment of the present disclosure, the interface layer 104 is amorphous. It should be understood that, the interface layer 104 is "amorphous", which particularly means that the material of the interface layer is an amorphous material in a non-crystalline form. Usually, a dielectric material is amorphous. The interface layer 104 may be formed by the technology and apparatus for forming the amorphous dielectric layer, thus simplifying the process and device for forming the interface layer 104 and reducing the cost. In addition, the interface layer 104 is formed from amorphous materials, so that the interface defects may be improved. The amorphous interface layer has no polarity, thus decreasing the density of interface traps caused by the polarity of the material. Meanwhile, the amorphous interface layer is better matched with the amorphous dielectric layer, so that interface defects are rarely caused, thus improving the interface quality of the semiconductor device.

Furthermore, in an embodiment, in the semiconductor structure for MISFET (metal-insulator-semiconductor field effect transistor) application, a thickness of the interface layer 104 is in a range of 2 to 100 nm. The MISFET includes a stacked structure of the metal layer 106/the interface layer 104/the substrate 102. In an embodiment, the interface layer 104 is formed by amorphous aluminium nitride or amorphous aluminium oxynitride, which is electrically insulated and could be served as an insulator layer in MISFET. For a common low voltage device, a thickness of the interface layer 104 may be controlled in the range of 2 to 10 nm, so that the interface quality may be improved by the interface layer 104 with an appropriate thickness and it is also possible to prevent an over thick interface layer 104 from decreasing the capacitance of the gate dielectric, thus preventing an increase in the electric leakage of the semiconductor structure caused by a decrease in the control ability of the gate. For a high voltage device reaching hundreds or thousands of volts, the thickness of the interface layer 104 may be controlled in the range of tens of nanometers.

In another embodiment, in the semiconductor structure for MOSFET (metal-oxide-semiconductor field effect transistor) application, a preferred thickness of the interface layer 104 is in a range of 1 to 3 nm. The MOSFET includes a stacked structure of the metal layer 106/the dielectric layer 108/the interface layer 104/the substrate 102, in which the dielectric layer 108 is served as an oxide layer. The interface quality may be improved by using the interface layer 104 with such a thickness, and it is also possible to prevent an over thick interface layer from decreasing the capacitance of the gate dielectric, thus preventing an increase in the electric leakage of the semiconductor structure caused by a decrease in the control ability of the gate.

According to embodiments of the present disclosure, the dielectric layer 108 may be formed from a high k dielectric. Thus, a dielectric layer with higher dielectric constant may be provided to the semiconductor structure by using the high k dielectric. In the case of a same gate capacitance, a thickness of the dielectric layer may be increased, so that the electric leakage of a gate electrode may be decreased, and the interface performance of the semiconductor structure may be further improved. According to embodiments of the present disclosure, in the semiconductor structure, the high k dielectric may include at least one selected from $Al_2O_3$, $HfO_2$ and $TiO_2$. The material of the dielectric layer 108 is preferably amorphous $Al_2O_3$. Thus, the material of dielectric layer is suitable for the nitride semiconductor and the interface layer formed from aluminium nitride or aluminium oxynitride, so as to further improve the performance of the semiconductor structure.

According to embodiments of the present disclosure, in the semiconductor structure, the interface layer 104 and the dielectric layer 108 are formed by atomic layer deposition (ALD). Thus, the thicknesses and compositions of the interface layer 104 and the dielectric layer 108 may be controlled strictly so as to ensure the performance of the semiconductor structure. The dielectric layer 108 is in situ deposited immediately following the deposition of the interface layer 104, the interface qualities of the interface layer and the dielectric layer may be improved, so that the performance of the semiconductor structure may be further improved. Meanwhile, the cost may be reduced because the process is simplified and the cost of the atomic layer deposition (ALD) apparatus is low.

According to embodiments of the present disclosure, the metal layer 106 is formed on the surface of the dielectric layer 108 away from the interface layer 104. Thus, the metal layer 106 may be used as a gate electrode of the semiconductor structure, so as to achieve functions of the semiconductor structure. It should be understood that the specific composition, shape and structure of the metal layer 106 are not particularly limited. The metal layer 106 may be formed on the upper surface of the dielectric layer 108 based on the specific requirement on the semiconductor structure in practice. For example, the metal layer 106 may be formed from aluminum, nickel or platinum. Moreover, the metal layer 106 may have the same shape and area as the dielectric layer 108, and the metal layer 106 may cover a part of the dielectric layer 108. Thus, functions of the semiconductor structure may be achieved.

In conclusion, with the semiconductor structure according to embodiments of the present disclosure, the substrate 102 with the semi-polar surface or nonpolar surface may be used. By forming the dielectric layer 108 and the interface layer 104, unstable chemical bonds between the metal atoms and the oxygen atoms in the substrate 102 may be inhibited effectively and the adsorption of the interface to the movable electric charges may be inhibited, so that the interface performance of the semiconductor structure may be improved.

In a second aspect of the present disclosure, a field effect transistor is provided. According to embodiments of the present disclosure, the field effect transistor includes the semiconductor structure described above. The field effect transistor has a metal-insulator-semiconductor field effect transistor (MISFET) structure or a metal-oxide-semiconductor field effect transistor (MOSFET) structure with a non-polar or semi-polar nitride semiconductor material as a channel. Thus, the above-mentioned semiconductor structure with a great interface performance may be included in the field effect transistor, so that the performance of the field effect transistor may be improved. Because the semiconductor structure described above is included in the field effect transistor, the field effect transistor has all features and advantages of the semiconductor structure described above, which is no more explained here.

In a third aspect of the present disclosure, a method for forming a semiconductor structure is provided. According to embodiments of the present disclosure, with reference to FIGS. 3-5, the method includes following steps.

Step S100: a substrate is provided.

According to embodiments of the present disclosure, in this step, a nitride semiconductor crystal is used to form the substrate and at least a part of the upper surface of the substrate is the nonpolar surface or semi-polar surface formed from nitride semiconductor crystals. Compared with a polar surface, the nonpolar surface or semi-polar surface has a significantly reduced adsorption ability, so that an ability of forming unstable chemical bonds between metal atoms and oxygen atoms in the substrate with the nonpolar surface or semi-polar surface and an ability of adsorbing movable electric charges at the interface of the nonpolar surface or the semi-polar surface are also much lower than that of the substrate with the polar surface. Thus, the semiconductor structure formed by the inventive method may have good interface performance.

According to embodiments of the present disclosure, the substrate may include at least one crystal sub-layer including at least one selected from GaN crystals, InGaN crystals, AlGaN crystals and AlN crystals. According to another embodiment of the present disclosure, the substrate may be a gallium nitride wafer or an aluminium nitride wafer, specifically, the substrate may be a freestanding GaN wafer, a silicon-based gallium nitride wafer, a SiC-based gallium nitride wafer, a sapphire-based gallium nitride wafer, a freestanding AlN wafer, a silicon-based aluminium nitride wafer, a SiC-based aluminium nitride wafer, a sapphire-based aluminium nitride wafer. Features and advantages of the substrate formed by the above material are described in details above, which are no more explained here.

Step S200: an interface layer is formed.

According to embodiments of the present disclosure, in this step, the interface layer is formed on the surface of the substrate. Specifically, according to embodiments of the present disclosure, the interface layer is formed on the upper surface of the substrate, i.e., the nonpolar surface or semi-polar surface. The interface layer may include a nitride or an oxynitride. In addition, the interface layer may be amorphous. Thus, the fabrication requirement of the interface layer may be simplified and the interface layer may be formed from amorphous materials, so that the interface performance of the semiconductor structure formed by such a method may be further improved. Specifically, the interface layer may be formed on the surface of the substrate by atomic layer deposition.

In an embodiment, in the semiconductor structure for MISFET (metal-insulator-semiconductor field effect transistor) application, a thickness of the interface layer is in a range of 2 to 100 nm. The MISFET includes a stacked structure of metal/insulator layer/semiconductor channel. In an embodiment, the interface layer is formed by amorphous aluminium nitride or amorphous aluminium oxynitride, which is electrically insulated and could be served as the insulator layer in MISFET with the nonpolar or semi-polar nitride semiconductor substrate as the semiconductor channel. For a common low voltage device, a thickness of the interface layer may be controlled in the range of 2 to 10 nm, so that the interface quality may be improved by the interface layer with an appropriate thickness and it is also possible to prevent an over thick interface layer from decreasing the capacitance of the gate dielectric, thus preventing an increase in the electric leakage of the semiconductor structure caused by a decrease in the control ability of the gate. For a high voltage device reaching hundreds or thousands of volts, the thickness of the interface layer may be controlled in the range of tens of nanometers.

In another embodiment, in the semiconductor structure for MOSFET (metal-oxide-semiconductor field effect transistor) application, a preferred thickness of the interface layer is in a range of 1 to 3 nm. The MOSFET includes a stacked structure of metal/dielectric layer/interface layer/semiconductor channel, in which the nonpolar or semi-polar nitride semiconductor substrate is served as the semiconductor channel, and the dielectric layer is served as an oxide layer. Based on the specific situation of the atomic layer deposition apparatus in practice, corresponding parameters of the atomic layer deposition may be adjusted, only if the interface layer formed by the atomic layer deposition has the above features. For example, according to embodiments of the present disclosure, a temperature of the substrate may be set in a range of 200 to 400° C. during the atomic layer deposition. Features and advantages of the interface layer formed from the above material are described in details above, which are no more explained here.

Figure 5:
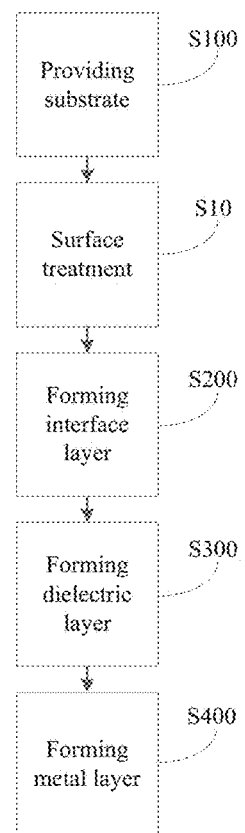
FIG. 5 is a flow chart of a method for forming a semiconductor structure according to still another embodiment of the present disclosure.

In addition, according to embodiments of the present disclosure, with reference to FIG. 5, in order to further improve the performance of the semiconductor structure fabricated by such a method, before forming the interface layer, the method for forming a semiconductor structure may further include following step S10.

Step S10: surface treatment

According to embodiments of the present disclosure, in this step, the substrate is subjected to a surface treatment including a dry etching or a wet etching, so as to remove natural oxides on a surface of the substrate. Thus, a clean substrate may be obtained, and the efficiency and effect of the subsequent treatment may be improved. It is also possible to prevent the natural oxides described above from affecting the performance of the semiconductor structure fabricated by such a method.

Specifically, according to embodiments of the present disclosure, a plasma etching with $N_2$ as a gas source may be used as the dry etching. The surface of the substrate is treated by the plasma, so as to remove naturally-formed oxides possibly present on the surface of the substrate, thus obtaining a clean surface. Based on the specific situation of forming the surface of the substrate in practice, the specific parameters of the plasma etching may be adjusted, only if the oxides on the surface of the substrate may be removed and at the same time the surface of the substrate is not damaged. For example, an atomic layer deposition apparatus with an enhanced function of the plasma source may be used. Before forming the interface layer, the substrate is in situ treated by a low power plasma etching with $N_2$ as gas source, using nitrogen plasma to bombard and remove the natural oxide layer on the surface of the substrate. Thus, an operation flow of such a method for fabricating the semiconductor structure may be simplified.

In addition, according to embodiments of the present disclosure, the wet etching may also be used to remove the oxides on the surface of the substrate. Because most of the natural oxides formed on the surface of the substrate are oxides formed by metal atoms and oxygen atoms, an aqua regia may be easily used to treat the substrate. Thus, the aqua regia may be used to remove the oxides on the surface of the substrate by chemical etching, so that the efficiency and effect of the method for preparing the semiconductor structure may be improved.

Step S300: a dielectric layer is formed.

According to embodiments of the present disclosure, in this step, the dielectric layer may be formed on the upper surface of the interface layer, i.e., a surface of the interface layer away from the substrate. According to embodiments of the present disclosure, the dielectric layer may be formed from a high k dielectric and the high k dielectric may include at least one selected from $Al_2O_3$, $HfO_2$ and $TiO_2$. The material of the dielectric layer is preferably amorphous $Al_2O_3$. Thus, a matching degree of the dielectric layer formed from the k dielectric with the interface layer may be improved, so as to further improve the performance of the semiconductor structure formed by the inventive method. Specifically, the dielectric layer may be formed on the upper surface of the interface layer by using the atomic layer deposition. The thickness of the dielectric layer may be determined by the performance requirement of the device, generally being tens of nanometers. Based on the specific situation of the atomic layer deposition apparatus in practice, corresponding parameters of the atomic layer deposition may be adjusted, only if the dielectric layer formed by the atomic layer deposition has the above features. For example, according to embodiments of the present disclosure, a temperature of the substrate may be set in a range of 200 to 400° C. during the atomic layer deposition. According to a preferred embodiment of the present disclosure, the dielectric layer is in situ deposited immediately following the deposition of the interface layer, the interface qualities of the interface layer and the dielectric layer may be improved, so that the performance of the semiconductor structure may be further improved. Meanwhile, the cost may be reduced because the process is simplified and the cost of the atomic layer deposition apparatus is low. Features and advantages of the dielectric layer formed by the above material are described in details above, which are no more explained here.

Step S400: a metal layer is formed.

According to embodiments of the present disclosure, in this step, the metal layer is formed on the upper surface of the dielectric layer, i.e., the surface of the dielectric layer away from the interface layer. Thus, the metal layer may be used as a gate electrode of the semiconductor structure, so as to achieve functions of the semiconductor structure. It should be understood that the specific composition, shape and structure of the metal layer are not particularly limited. Based on the specific requirement on the semiconductor structure in practice, the metal layer may be formed on the upper surface of the dielectric layer in a selected suitable manner.

Figure 3:
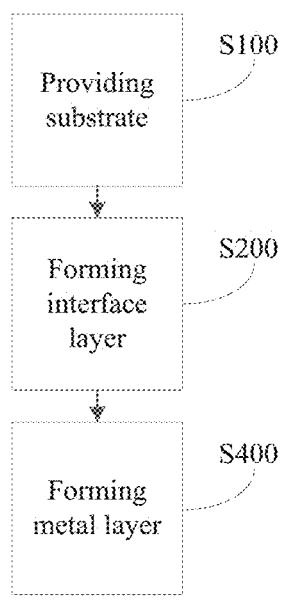
FIG. 3 is a flow chart of a method for forming a semiconductor structure according to an embodiment of the present disclosure.
Figure 4:
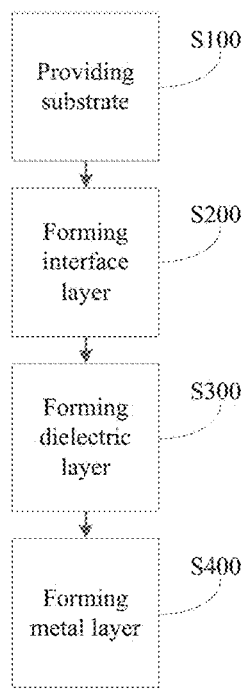
FIG. 4 is a flow chart of a method for forming a semiconductor structure according to another embodiment of the present disclosure.

In the above embodiment, the method includes steps S100, S10, S200, S300 and S400, as shown in FIG. 5. In an alternative embodiment, the method includes steps S100, S200 and S400, as shown in FIG. 3. In a further embodiment, the method includes steps S100. S200, S300 and S400, as shown in FIG. 4.

The present disclosure will be further described in details as follows. It should be understood that the following embodiments are only used for description, and the scope of the present disclosure should not be limited in any manner. In addition, unless specified or limited otherwise, methods with conditions or steps not specified are all common methods and agents and materials are all commercially available. Specifically, the ellipsometer is Uvisel from HORIBA Jobin Yvon, the transmission electron microscope is JEM-2010 from JEOL, and a semiconductor analyzer from Agilent with a model of B1500A is used for the C-V test of the electrical performance of the semiconductor structures.

Example 1. Fabrication of Al/$Al_2O_3$/AlN/m-GaN Semiconductor Structure on m-Plane GaN Substrate The freestanding GaN wafer is selected as the substrate. Moreover, the surface of the freestanding GaN wafer is a nonpolar m-plane. The specific fabrication process is as follows:

(i) The GaN substrate was sequentially immersed in acetone and alcohol heated in a water bath at 65° C. for 20 min.

(ii) The GaN substrate was washed with deionized water for 10 min and immersed in isopropanol for 5 min.

(iii) An aqua regia solution was prepared and put in a water bath at 65° C., and then the GaN substrate was put in the aqua regia solution for 40 min, so as to remove natural oxides on the surface of the GaN substrate.

(iv) The GaN substrate was washed with deionized water for 10 min and immersed in isopropanol for 5 min, and then dried with $N_2$.

(v) The washed substrate was immediately put in an ALD chamber for deposition. Aluminum nitride was deposited on the m-plane of the GaN wafer. An amorphous aluminum nitride interface layer was formed using $NH_3$ and trimethylaluminium (TMA) as precursors at 250° C. for 30 cycles. Subsequently, $Al_2O_3$ was deposited on the interface layer using $H_2O$ and TMA as precursors at 250° C. for 100 cycles to form an $Al_2O_3$ dielectric layer. The $Al_2O_3$ dielectric layer was tested by an ellipsometer and a thickness of the $Al_2O_3$ dielectric layer was 10.8 nm. After the dielectric layer was deposited, an Al layer with a thickness of 200 nm was sputtered as the metal layer.

Figure 6:
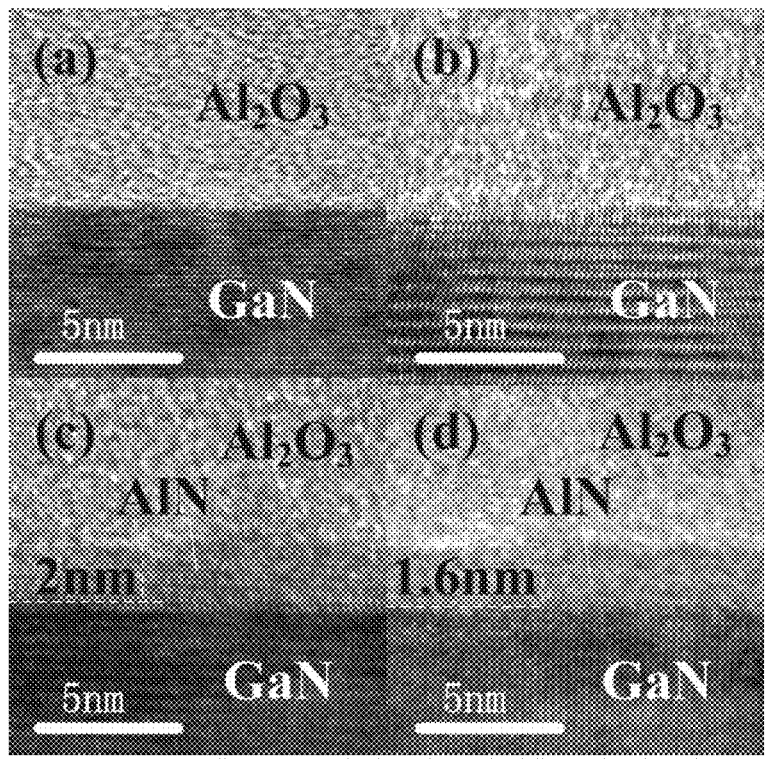
FIG. 6 is a transmission electron microscopy (TEM) images of semiconductor structures formed in inventive example 1 and comparable examples 1 to 3.

The transmission electron microscopy (TEM) image of the fabricated semiconductor structure is shown in FIG. 6(d). It may be observed from the figure that a thickness of the AlN interface layer in the Al/$Al_2O_3$/AlN/m-GaN structure is 1.6 nm.

Example 2. Fabrication of Al/$Al_2O_3$/AlN/a-GaN Semiconductor Structure on a-Plane GaN Substrate The freestanding GaN wafer is selected as the substrate. Moreover, the surface of the freestanding GaN wafer is a nonpolar a-plane. The remaining fabrication process is the same as that in example 1.

Comparable Example 1. Fabrication of Al/Al$_2$O$_3$/m-GaN Semiconductor Structure on m-Plane GaN Substrate The selection of substrate materials and the specific operation may be referred to example 1 in detail. The difference is that, in step (v), when the atomic layer was deposited, without the deposition of the aluminum nitride interface layer, Al$_2$O$_3$ was directly deposited on the substrate using H$_2$O and TMA as precursors at 250° C. for 100 cycles. The TEM image of the fabricated semiconductor structure is shown in FIG. 6(b).

Comparable Example 2. Fabrication of Al/Al$_2$O$_3$/AlN/c-GaN Semiconductor Structure on c-Plane GaN Substrate The selection of substrate materials and the specific operation may be referred to example 1 in detail. The difference is that, the surface of the freestanding GaN wafer is a polar c-plane. In step (v), when the washed substrate was deposited in the ALD chamber, aluminum nitride and Al$_2$O$_3$ were in situ deposited on the c-plane of the GaN wafer. The TEM image of the fabricated semiconductor structure is shown in FIG. 6(c). It may be observed from the figure that a thickness of the AlN interface layer in the Al/Al$_2$O$_3$/AlN/c-GaN structure is 2 nm.

Comparable Example 3. Fabrication of Al/Al$_2$O$_3$/c-GaN Semiconductor Structure on c-Plane GaN Substrate The selection of substrate materials and the specific operation may be referred to example 1 in detail. The difference is that, the surface of the freestanding GaN wafer is a polar c-plane. In step (v), when the washed substrate was deposited in the ALD chamber, without the deposition of aluminum nitride, Al$_2$O$_3$ was directly deposited on the c-plane of the GaN wafer. The TEM image of the fabricated semiconductor structure is shown in FIG. 6(a).

Interface Performance Test

The fabricated semiconductor structure of example 1 and comparable examples 1 to 3 were subjected to a lithography and a dry etching, which may be a well-known process. A size of a fabricated capacitor is 100×100 μm$^2$ and interface trap densities (D$_{it}$) of the samples were calculated by C-V (capacitance-voltage) test.

Figure 7:
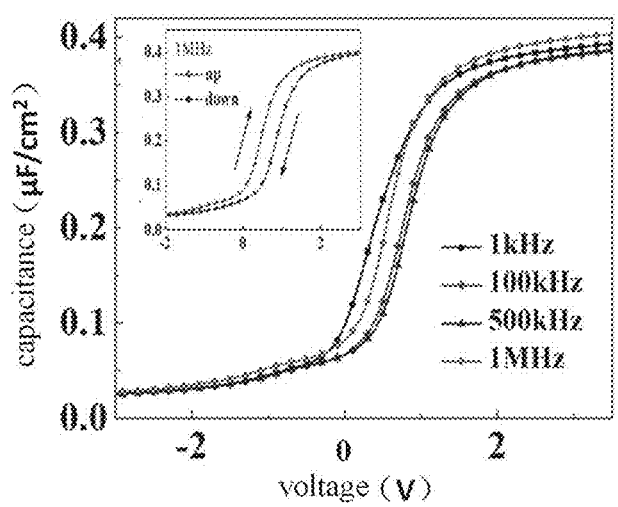
FIG. 7 is a C-V curve of the interface performance of a semiconductor structure of comparable example 3.
Figure 8:
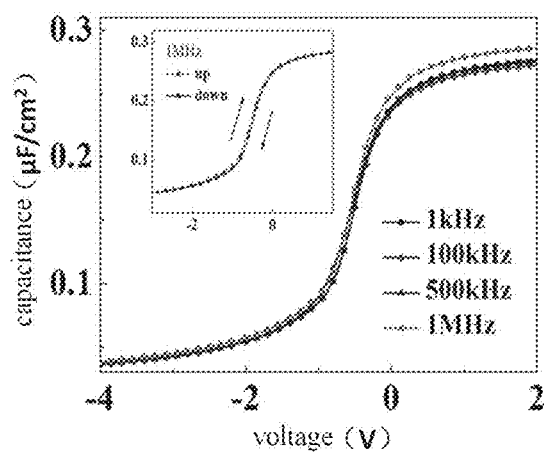
FIG. 8 is a C-V curve of the interface performance of a semiconductor structure of comparable example 1.
Figure 9:
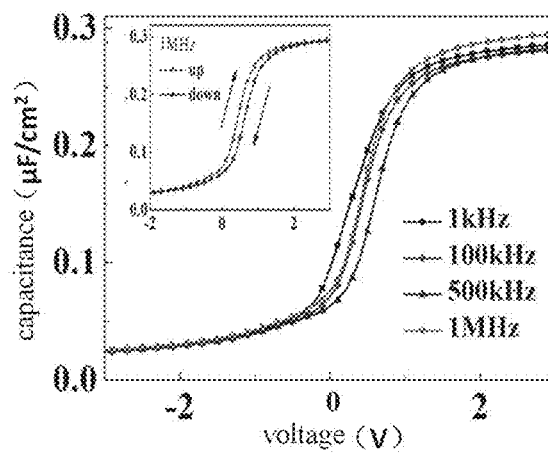
FIG. 9 is a C-V curve of the interface performance of a semiconductor structure of comparable example 2.
Figure 10:
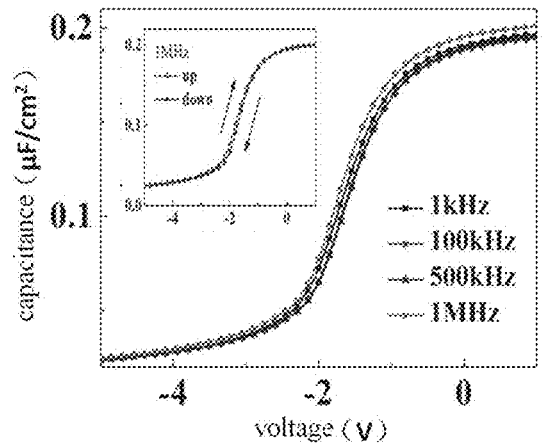
FIG. 10 is a C-V curve of the interface performance of a semiconductor structure of inventive example 1.

With reference to FIG. 7 to FIG. 10, four semiconductor structure samples were subjected to the C-V test. FIG. 7 shows a result of the C-V test of the comparable example 3 (Al/Al$_2$O$_3$/c-GaN sample), FIG. 8 shows a result of the C-V test of the comparable example 1 (Al/Al$_2$O$_3$/m-GaN sample), FIG. 9 shows a result of the C-V test of the comparable example 2 (Al/Al$_2$O$_3$/AlN/c-GaN sample) and FIG. 10 shows a result of the C-V test of the example 1 (Al/Al$_2$O$_3$/AlN/m-GaN sample). In accordance with the results of the C-V tests, it may be calculated that, a D$_{it}$ of a capacitor on the m-plane of the GaN wafer with an aluminum nitride interface layer formed thereon was 8.4×10$^{10}$ cm$^{-2}$ eV$^{-1}$ (the sample of example 1, FIG. 10), hysteresis and dispersion of the capacitor sample were the least in the four samples. However, a D$_{it}$ of a capacitor on the m-plane of the GaN wafer without an aluminum nitride interface layer was 2.7×10$^{11}$ cm$^{-2}$ eV$^{-1}$ (the sample of comparable example 1, FIG. 8), its hysteresis and dispersion are both larger than those of the sample fabricated in example 1, but still less than those of the sample containing an aluminum nitride interface layer fabricated on the c-plane of the GaN wafer (comparable example 2, a D$_{it}$ of a capacitor on the c-plane of the GaN wafer with an aluminum nitride interface layer formed thereon was 1.14×10$^{12}$ cm$^{×2}$ eV$^{-1}$, with reference to FIG. 9). A D$_{it}$ of a capacitor on the c-plane of the GaN wafer without an aluminum nitride interface layer was 2.6×10$^{12}$ cm$^{-2}$ eV$^{-1}$, and the sample has a worst interface quality (FIG. 7, comparable example 3). It may be seen that, the semiconductor structure according to embodiments of the present disclosure may have distinctly improved interface trap density and effectively improved interface quality.

Example 3. Fabrication of GaN Semiconductor Structure

The freestanding GaN wafer is selected as the semiconductor layer. Moreover, the surface of the freestanding GaN wafer is a nonpolar m-plane. The specific fabrication process is as follows:

(i) The GaN semiconductor layer was sequentially immersed in acetone and alcohol heated in a water bath at 65° C. for 20 min.

(ii) The GaN semiconductor layer was washed with deionized water for 10 min and immersed in isopropanol for 5 min.

(iii) An aqua regia solution was prepared and put in a water bath at 65° C., and then the GaN wafer was put in the aqua regia solution for 40 min, so as to remove natural oxides on the surface of the GaN wafer.

(iv) The semiconductor layer was washed with deionized water for 10 min and immersed in isopropanol for 5 min, and then dried with N$_2$.

(v) The washed sample was immediately put in an ALD chamber for deposition. A nitride was deposited on the m-plane of the GaN wafer. An amorphous aluminum nitride interface layer was formed using NH$_3$ and trimethylaluminium (TMA) as precursors at 250° C. for 150 cycles. An Al layer with a thickness of 200 nm was sputtered as the metal layer.

The fabricated semiconductor structure of example 4 was subjected to a lithography or a dry etching, which may be a well-known process. A size of a fabricated capacitor is 100×100 μm$^2$ and interface trap densities of the samples were calculated by C-V (capacitance-voltage) test. The calculation shows that a D$_{it}$ may achieve a magnitude of 10$^{10}$ cm$^{-2}$ eV$^{-1}$, which is much lower than that of the capacitor fabricated by a polar c-plane of the GaN wafer (a D$_{it}$ may achieve a magnitude of 10$^{12}$ cm$^{-2}$ eV$^{-1}$).

Example 4. Fabrication of GaN/InGaN/GaN Semiconductor Structure

The freestanding GaN wafer is selected as the substrate. Moreover, one surface of the freestanding GaN wafer is a nonpolar a-plane. A GaN/InGaN/GaN semiconductor film was epitaxially grown on the surface of the substrate. The remaining fabrication process is the same as that in example 3.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment". "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A semiconductor structure, comprising:
    a substrate, at least a part of an upper surface of the substrate being a nonpolar surface or a semi-polar surface comprising nitride semiconductor crystals;
    an interface layer formed immediately on the nonpolar surface or the semi-polar surface, and comprising aluminium oxynitride and being electrically insulated; and
    a metal layer formed directly on and in physical contact with a surface of the interface layer away from the substrate such that the interface layer is positioned between the nonpolar surface or the semi-polar surface and the metal layer.

2. The semiconductor structure according to claim 1, wherein the substrate comprises at least one crystal sub-layer comprising at least one selected from GaN crystals, InGaN crystals, AlGaN crystals and AlN crystals.

3. The semiconductor structure according to claim 1, wherein the substrate is a gallium nitride wafer or an aluminium nitride wafer.

4. The semiconductor structure according to claim 1, wherein the interface layer is amorphous.

5. The semiconductor structure according to claim 1, wherein a thickness of the interface layer is in a range of 2 to 100 nm.

6. A method for forming a semiconductor structure, comprising:
    providing a substrate, at least a part of an upper surface of the substrate being a nonpolar surface or a semi-polar surface comprising nitride semiconductor crystals;
    forming an interface layer immediately on the nonpolar surface or the semi-polar surface, in which the interface layer comprises aluminium oxynitride and is electrically insulated; and
    forming a metal layer directly on and in physical contact with a surface of the interface layer away from the substrate such that the interface layer is positioned between the nonpolar surface or the semi-polar surface and the metal layer.

7. The method according to claim 6, wherein before forming an interface layer on the nonpolar surface or the semi-polar surface, the substrate is subjected to a surface treatment, the surface treatment comprising:
    a dry etching or a wet etching, so as to remove natural oxides on a surface of the substrate,
    wherein the dry etching is a plasma etching with $N_2$ as a gas source, and
    the wet etching is an aqua regia etching.

8. The method according to claim 6, wherein in forming an interface layer on the nonpolar surface or the semi-polar surface, the interface layer is formed by atomic layer deposition,
    wherein when the interface layer is formed by the atomic layer deposition, a temperature of the substrate is in a range of 200 to 400° C.

9. The method according to claim 6, wherein the substrate comprises at least one crystal sub-layer comprising at least one selected from GaN crystals, InGaN crystals, AlGaN crystals and AlN crystals.

10. The method according to claim 6, wherein the substrate is a gallium nitride wafer or an aluminium nitride wafer.

11. The method according to claim 6, wherein the interface layer is amorphous.

12. A method for forming a semiconductor structure, comprising:
    providing a substrate, at least a part of an upper surface of the substrate being a nonpolar surface or a semi-polar surface comprising nitride semiconductor crystals;
    forming an interface layer on the nonpolar surface or the semi-polar surface;
    forming a metal layer on a surface of the interface layer away from the substrate;
    forming a dielectric layer between the interface layer and the metal layer;
    wherein in forming an interface layer on the nonpolar surface or the semi-polar surface, the interface layer is formed by atomic layer deposition, and the dielectric layer is formed by atomic layer deposition;
    wherein when the interface layer and the dielectric layer are formed by the atomic layer deposition respectively, a temperature of the substrate is in a range of 200 to 400° C.

* * * * *